United States Patent
Chien et al.

(10) Patent No.: US 9,318,567 B2
(45) Date of Patent: Apr. 19, 2016

(54) FABRICATION METHOD FOR SEMICONDUCTOR DEVICES

(75) Inventors: Chin-Cheng Chien, Tainan (TW); Chun-Yuan Wu, Yun-Lin County (TW); Chin-Fu Lin, Tainan (TW); Chih-Chien Liu, Taipei (TW); Chia-Lin Hsu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 639 days.

(21) Appl. No.: 13/603,425

(22) Filed: Sep. 5, 2012

(65) Prior Publication Data

US 2014/0065775 A1   Mar. 6, 2014

(51) Int. Cl.
| H01L 21/31 | (2006.01) |
| H01L 21/84 | (2006.01) |
| H01L 21/311 | (2006.01) |
| H01L 29/417 | (2006.01) |
| H01L 29/66 | (2006.01) |
| H01L 29/78 | (2006.01) |

(52) U.S. Cl.
CPC .... *H01L 29/41791* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 6,043,138 | A  | 3/2000  | Ibok |
| 6,492,216 | B1 | 12/2002 | Yeo |
| 6,921,963 | B2 | 7/2005  | Krivokapic |
| 7,087,477 | B2 | 8/2006  | Fried |
| 7,091,551 | B1 | 8/2006  | Anderson |
| 7,247,887 | B2 | 7/2007  | King |
| 7,250,658 | B2 | 7/2007  | Doris |
| 7,309,626 | B2 | 12/2007 | Ieong |
| 7,352,034 | B2 | 4/2008  | Booth, Jr. |
| 7,399,664 | B1 * | 7/2008 | Anderson et al. ............. 438/157 |
| 7,435,683 | B2 | 10/2008 | Kavalieros |
| 7,470,570 | B2 | 12/2008 | Beintner |
| 7,531,437 | B2 | 5/2009  | Brask |
| 7,569,857 | B2 | 8/2009  | Simon |
| 2004/0195624 | A1 | 10/2004 | Liu |
| 2005/0051825 | A1 | 3/2005  | Fujiwara |
| 2005/0148137 | A1 * | 7/2005 | Brask et al. ................... 438/216 |
| 2006/0068540 | A1 * | 3/2006 | Min et al. ...................... 438/202 |
| 2006/0071275 | A1 * | 4/2006 | Brask et al. ................... 257/350 |
| 2006/0099830 | A1 | 5/2006  | Walther |
| 2006/0286729 | A1 | 12/2006 | Kavalieros |
| 2007/0108528 | A1 | 5/2007  | Anderson |
| 2007/0158756 | A1 | 7/2007  | Dreeskornfeld |
| 2008/0157208 | A1 | 7/2008  | Fischer |
| 2009/0124097 | A1 | 5/2009  | Cheng |

(Continued)

*Primary Examiner* — Calvin Choi
*Assistant Examiner* — Xiaoming Liu
(74) *Attorney, Agent, or Firm* — Winston Hsu; Scott Margo

(57) ABSTRACT

A method of fabricating a semiconductor device includes the following steps. First, a semiconductor substrate is provided, which includes at least a fin structure and at least a gate semiconductor layer disposed thereon. The gate semiconductor layer covers a portion of the fin structure. Then a sacrificial layer is deposited to cover the fin structure entirely. Subsequently, a top surface of the fin structure is exposed from the sacrificial layer through an etching process. A material layer is then deposited, which covers the gate semiconductor layer, the fin structure and the sacrificial layer conformally. Finally, the material layer is etched until the top surface of the fin structure is exposed and a first spacer is concurrently formed on side surfaces of the gate semiconductor layer.

20 Claims, 6 Drawing Sheets

(56) References Cited

U.S. PATENT DOCUMENTS

| | | |
|---|---|---|
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0117679 A1* | 5/2011 | Lee et al. .......................... 438/5 |
| 2011/0147828 A1* | 6/2011 | Murthy et al. ................ 257/327 |
| 2012/0032732 A1* | 2/2012 | Xiao et al. ..................... 327/537 |

* cited by examiner

FABRICATION METHOD FOR SEMICONDUCTOR DEVICES

BACKGROUND OF THE INVENTION

1. Field of the Invention

The present invention generally relates to a method of fabricating a field effect transistor, and more particularly, to a method of fabricating a multi-gate field effect transistor.

2. Description of the Prior Art

With the trend in the industry going towards scaling down the size of metal oxide semiconductor (MOS) transistors, three-dimensional or non-planar transistor technology has been developed to replace conventional planar MOS transistors.

In general, three-dimensional transistor devices could be of many kinds, such as dual-gate fin field effect transistors (dual-gate FinFETs), tri-gate field effect transistors (tri-gate FETs) and so forth, which allow tighter packing of the same number of transistors on a semiconductor chip by using vertical or tilted surfaces for the gates. For example, a dual-gate transistor comprises equal length gates situated along the sides of a narrow body, whereas a tri-gate transistor comprises three equal length gates situated on three exposed surfaces of a body. Whether in a dual-gate FinFET or a tri-gate FET, an overlapped region between a gate and a body in each FET can be increased effectively compared to conventional planar transistors. As a result, when a similar driving voltage is separately applied to a non-planar and a planar transistor, a current flowing through the channel regions of the non-planar transistor is often higher than that in the planar transistor.

An overall contact resistance of the tri-gate FET is a function of a contact resistance of the top gate and a contact resistance of each of the two side gates. The contact resistance at each gate is determined partly by the contact area of the source and drain, the materials used at the interface of the source and drain regions, such as a silicide layer, and the manner in which those materials interface. The silicide layer may be formed on the source and the drain regions for the top and side gates of a multi-gate FET to reduce the contact resistance, thereby increasing a FET current. The contact resistance can rise when a portion of the silicide material is blocked or is otherwise prevented from contacting a source or drain region.

There is still a need to provide a method of fabricating a non-planar (also called multi-gate) FET in order to overcome the above-mentioned drawbacks about high contact resistance.

SUMMARY OF THE INVENTION

One objective of the present invention is to provide a method of fabricating a semiconductor device in order to overcome the drawbacks of conventional semiconductor devices.

According to one embodiment of the invention, a method of fabricating a semiconductor device includes the following processes. A semiconductor substrate is first provided. Then, at least a fin structure and at least a gate semiconductor layer are sequentially disposed on the semiconductor substrate, wherein the gate semiconductor layer covers a portion of the fin structure. A sacrificial layer is deposited to cover the fin structure entirely. Subsequently, a top surface of the fin structure is exposed from the sacrificial layer through an etching process. Then, a material layer is deposited to conformally cover the gate semiconductor layer, the fin structure and the sacrificial layer. Finally, the material layer is etched until the top surface of the fin structure is exposed and a first spacer is concurrently formed on side surfaces of the gate semiconductor layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1-9 are diagrams showing a method for fabricating a semiconductor device according to one embodiment of the invention, wherein FIG. 2 is a schematic drawing of a step subsequent to FIG. 1;

FIG. 3 is a schematic drawing of a step subsequent to FIG. 2;

FIG. 4 is a schematic drawing of a step subsequent to FIG. 3;

FIG. 5 is a schematic drawing of a step subsequent to FIG. 4;

FIG. 6 is a schematic drawing of a step subsequent to FIG. 5;

FIG. 7 is a schematic, perspective view of a step subsequent to FIG. 6;

FIG. 8 is a schematic, perspective view of a step subsequent to FIG. 6; and

FIG. 9 is a schematic drawing of a step subsequent to FIG. 7.

Figure 1:
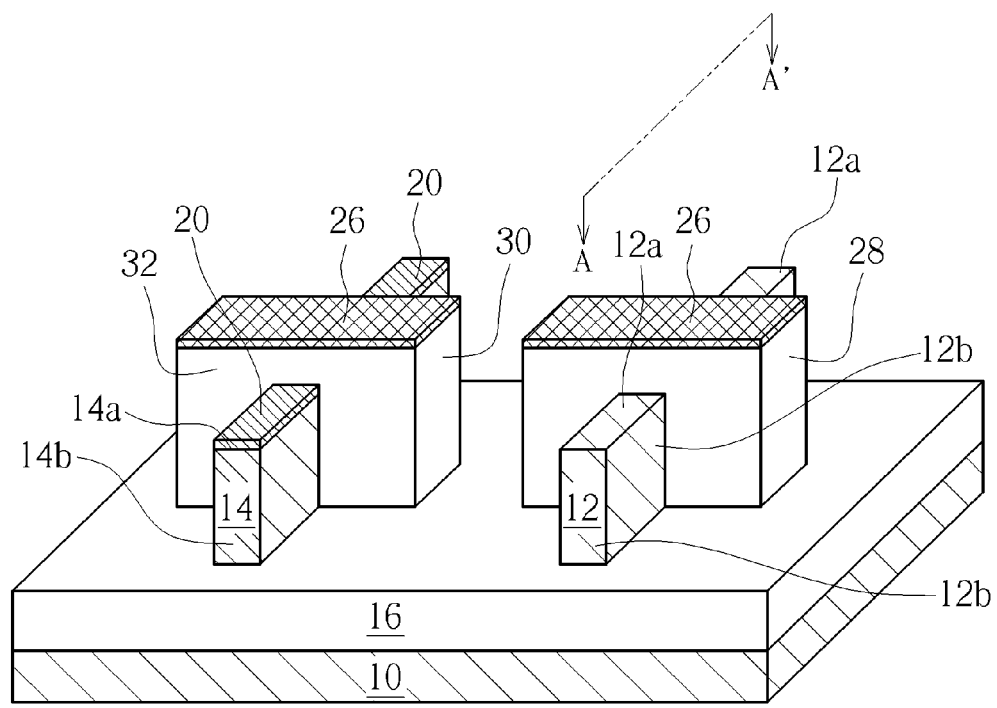

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Please refer to FIGS. 1 to 11, which are schematic diagrams showing a method of fabricating a semiconductor device according to one embodiment of the invention. As shown in FIG. 1, FIG. 1 is a perspective view of a semiconductor device at a beginning stage of a fabrication method. A semiconductor substrate 10, such as a silicon substrate or a silicon-on-insulator (SOI) substrate, is provided, which includes at least a first fin structure 12, at least a second fin structure 14 and an insulating layer 16 thereon. A lower portion of each fin structure 12 and 14 is surrounded by an insulating layer 16, such as silicon oxide, and a portion of the first fin structure 12 and a portion of the second fin structure 14 are respectively covered by the first gate semiconductor layer 28 and a second gate semiconductor layer 30. Therefore, overlapped regions between each fin structures 12 and 14 and the corresponding gate semiconductor layer 28 and 30 serve as a channel for the flow of charge carriers. Furthermore, a top surface of the first gate semiconductor layer 28 and that of the second gate semiconductor layer 30 are respectively covered by a mask layer 26, which is used to define a location of each gate semiconductor layer 28 and 30.

The processes for forming the above first fin structure 12 and the above second fin structure 14 may include steps like forming a patterned mask layer (not shown) on the semiconductor substrate 10 and then transferring the pattern of the patterned mask layer into the semiconductor substrate 10 through a suitable etching process. Then, the mask layer can be removed or not, according to requirements for the formation of corresponding tri-gate FETs or corresponding dual-gate FinFETs. Subsequently, an insulating layer 16 can be formed around a lower portion of each fin structure 12 and 14 through proper depositing and an etching back processes. Besides, the formation of the first fin structure 12 and the second fin structure 14 may be carried out by another procedure. For example, a patterned hard mask layer (not shown) is first defined on the semiconductor substrate 10. Then, at least one fin-shaped semiconductor layer may be formed on the semiconductor substrate 10 exposed from the patterned hard mask layer through an epitaxial growth process. As a result, this fin-shaped semiconductor layer may serve as the corresponding fin structure 12 and 14. Similarly, the patterned hard mask layer can also be removed or not, and an insulating layer 16 can be formed around a lower portion of each fin structure 12 and 14 through proper depositing and an etching back processes. Furthermore, when the semiconductor substrate 10 is a SOI substrate, fin structures may be formed in consecutive processes, such as fabricating a patterned mask layer on the SOI substrate to expose a portion of the semiconductor layer (i.e. the Si layer), etching the SOI substrate until the insulating layer (i.e. oxide layer) inside the SOI substrate is exposed from the patterned mask layer. Since the SOI substrate has an inherent insulating layer, there is no need to carry out another step to deposit the above-mentioned insulating layer 16.

A gate dielectric layer (not shown) may be further located between the respective gate semiconductor layer 18 and 30 and the fin structure 12 and 14. That is to say, each gate semiconductor layer 28 and 30 is not in direct contact with the corresponding fin structure 12 and 14. Additionally, the gate semiconductor layers 28 and 30 may include doped or un-doped silicon, metal silicide, metal or the like. And the composition of the gate dielectric layers may include silicon compounds or high-k dielectric layers. The silicon compounds include silicon oxide, silicon nitride, silicon oxynitride or the like, for example, while the composition of the high-k dielectric layers could be selected from the group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide ($Ta_2O_5$), zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

It is worth noting that two types of non-planar FET are illustrated in the case shown in FIG. 1. In the first part, since the top surface 12a and both side surfaces 12b of the first fin structure 12 are covered with the first gate semiconductor layer 28, carrier channels can therefore situate on the top surface 12a and both side surfaces 12b of the first fin structure 12. A FET including this gate structure is also called tri-gate FET. In comparison, since the top surface 14a of the second fin structure 14 is directly covered by a mask layer 20 like silicon nitride and only two opposite side surfaces 14b of the second fin structure 14 are covered by the second gate semiconductor layer 30, carrier channels can merely be situated on the two opposite side surfaces 14b. A FET including this gate structure is called dual-gate FinFET. In other words, FETs provided by the present invention could be a combination of a tri-gate FET and a dual-gate FinFET, but is not limited thereto. That is to say, in another embodiment, FETs could only be chosen from one type of FETs (either tri-gate FETs, dual-gate FinFETs or the likes).

In the following paragraph, a detailed description of a method for fabricating a semiconductor device will be presented. For the purpose of clarity, a tri-gate FET (the first fin structure 12 and the first gate semiconductor layer 28) will serve as a main subject matter for applying the present invention. However, without departing from the scope and the spirit of the present invention, the method may be equally applied to the fabrication of dual-gate FinFET (the second fin structure 14 and the second gate semiconductor layer 30) or other types of non-planar FETs.

Figure 2:
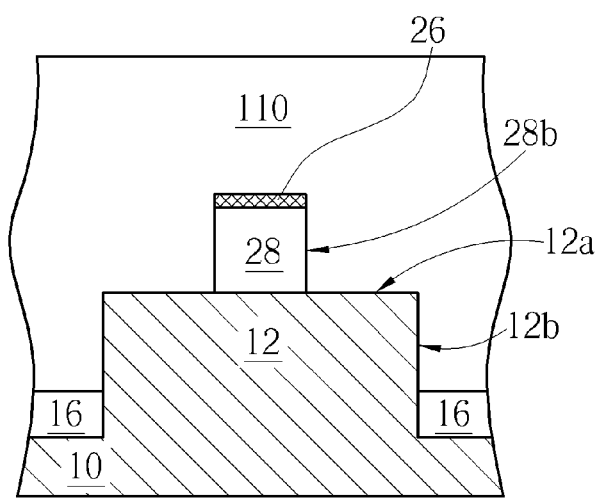
Figure 3:
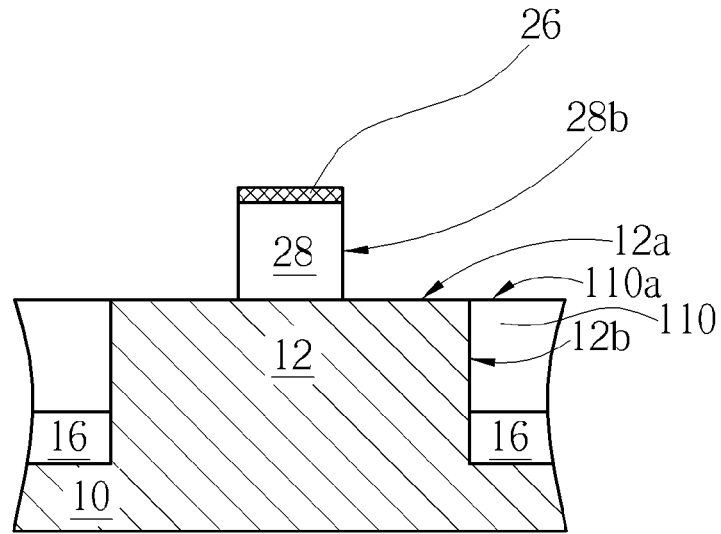

Please refer to FIG. 2. FIG. 2 is a schematic, cross-sectional diagram showing a semiconductor device taken along a section line AA' of FIG. 1. At this stage, a sacrificial layer 110 with an approximately planar surface is formed to entirely cover the first fin structure 12 and the first gate semiconductor layer 28. In this embodiment, the composition of the sacrificial layer 110 may include spin-on-dielectric (SOD) or advanced patterning film (APF) or the likes. Preferably, the sacrificial layer 110 is chosen from SOD. An exemplary procedure for depositing the SOD could be performed like described as following. First, a dielectric precursor, such as polysiloxane or polysilazane and so forth, is dissolved in a certain organic solvent and then spin-coated to the semiconductor substrate 10. Then, the solvent used to dissolve the dielectric precursor is evaporated through a proper baking process, like a soft baking process. It should be noted that, the baking process shall not include a high-temperature curing process. Preferably, it will include a low-temperature curing process has a temperature ranging from 200° C. to 400° C. In comparison with conventional SOD undergoing high-temperature curing process, the SOD in the present invention has a loose structure and is easy to be removed in the following process. According to another embodiment of the invention, if the composition of the sacrificial layer 110 is selected from an amorphous carbon film such as APF, Trademark of Applied Material, Inc., the corresponding fabrication processes may sequentially include a process for depositing APF and a planarization process, like chemical mechanical polishing (CMP) process, but are not limited thereto.

After the formation of the sacrificial layer 110, another planarization process, such as CMP process, may be further carried out to have the sacrificial layer 110 expose from the mask layer 26. At this time, the entire first fin structure 12 is still covered by the sacrificial layer 110. Additionally, CMP process can be one of the candidates to planarize the sacrificial layer 110. Please refer to FIG. 3. An etching process, such as a dry etching, a wet etching or the combination thereof, is carried out. During the etching process, the sacrificial layer 110 is etched until a top surface 12a of the first fin structure 12 is exposed from the sacrificial layer 110. Preferably, the etching process is a dry etching process and the top surface 110a of the sacrificial layer 110 is substantially leveled with the top surface 12a of the first fin structure 12 after the etching process. However, in a real case, the top surface 110a of the sacrificial layer 110 may be lower than the top surface 12a of the first fin structure 12 so that there is a distance between them and an upper portion of the side surfaces 12b may be exposed. It is worth noting that, in a well-controlled etching environment, etchant applied in the etching process can only remove the sacrificial layer 110 without removing the first gate semiconductor layer 28 and the first fin structure 12.

Figure 4:
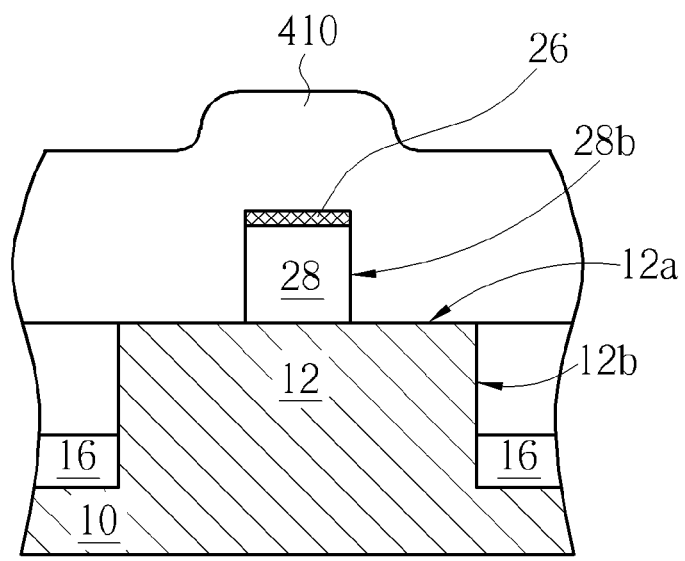

As shown in FIG. 4, a material layer 410 is then deposited to cover the first gate semiconductor layer 28, the first fin structure 12 and the sacrificial layer 110 conformally. The material layer 410 may be a single-layered structure or a multi-layered structure, which preferably includes low-K dielectric material. For example, in a case of single-layered structure, the components of the material layer 410 may be selected from silicon oxide, silicon nitride, silicon oxynitride or low-K dielectric material; in the other case, where material layer 410 includes the multi-layered structure, may include silicon nitride, silicon oxide, silicon oxynitride, low-K dielectric material or the combination thereof. According to one embodiment of the invention, if the material layer 410 is a multi-layered structure such as silicon oxide/silicon nitride, the thickness of the bottom silicon oxide is preferably smaller than two-thirds of that of the top silicon nitride. In addition, a process for forming the material layer 410 may include plasma enhanced chemical vapor deposition (PECVD), high density chemical vapor deposition (HDCVD) or sputtering, but is not limited thereto.

Figure 5:
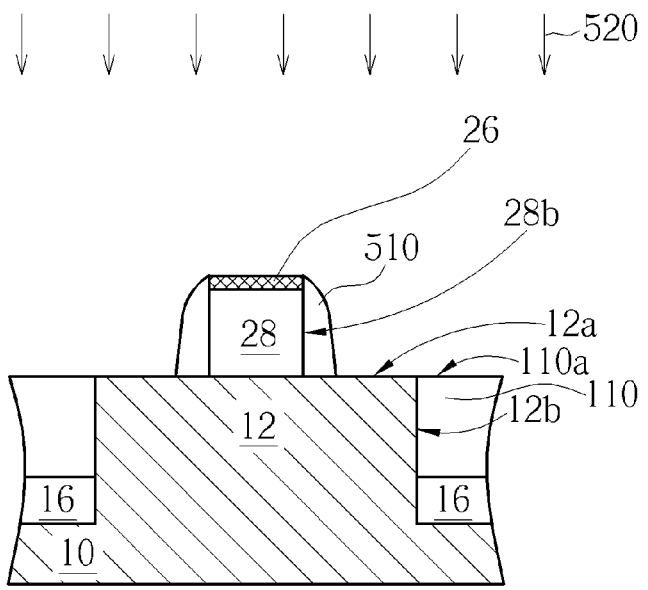

As shown in FIG. 5, a first etching procedure 520 is then carried out to etch the material layer 410 until the top surface 12a of the first fin structure 12 is exposed. Concurrently, at least a first spacer 510 is formed on the side surfaces 28b of the gate semiconductor layer 28. In a well-controlled etching environment, the etchant applied in the first etching procedure 520 can only etch the material layer 410 without etching the first fin structure 12, the mask layer 26 and the sacrificial layer 110. Preferably, the first etching procedure 520 is an anisotropic dry-etching procedure, such as magnetic enhanced RIE (MERIE) or an electron cyclotron resonance (ECR) and so forth. The etchant may include sulfur hexafluoride ($SF_6$), oxygen ($O_2$), fluorinated hydrocarbon ($CH_xF_y$), carbon monoxide (CO), argon (Ar) and so forth.

Figure 6:
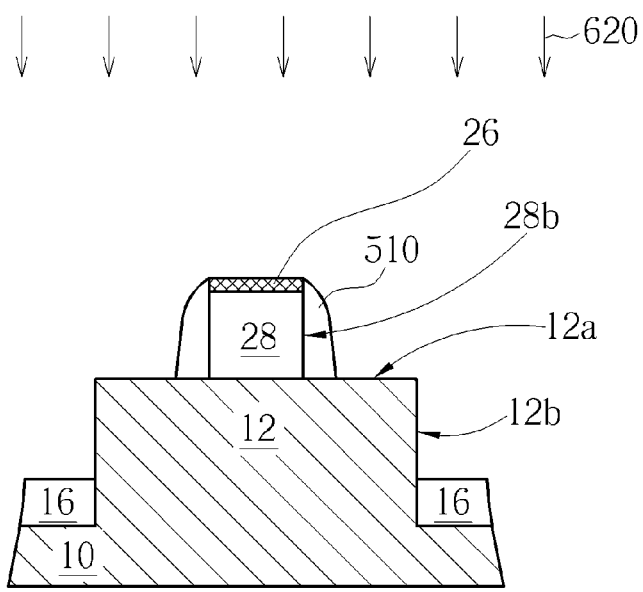

After the performance of the etching procedure 520, a second etching process may be further carried out in order to remove all of or a portion of the sacrificial layer 110. The corresponding processes are described as follows. Please refer to FIG. 6 to FIG. 7, which are schematic diagrams showing a structure where a portion of the sacrificial layer 110 is removed according to one embodiment of the invention. First, as shown in FIG. 6, a second etching procedure 620 with anisotropic etching property, like a dry etch process, is carried out to remove the sacrificial layer 110 not covered by the first spacer 510. The second etching procedure 620 will not stop until the surface of the insulating layer 16 is exposed. Therefore, a large portion of the top surface 12a and the side surfaces 12b of the first fin structure 12 can be exposed. In a well-controlled etching environment, the etchant applied in the second etching procedure 620 can only etch the sacrificial layer 110 without etching the insulating layer 16, the first fin structure 12, the mask layer 26 and the first spacer 510 (also called material layer).

Figure 7:
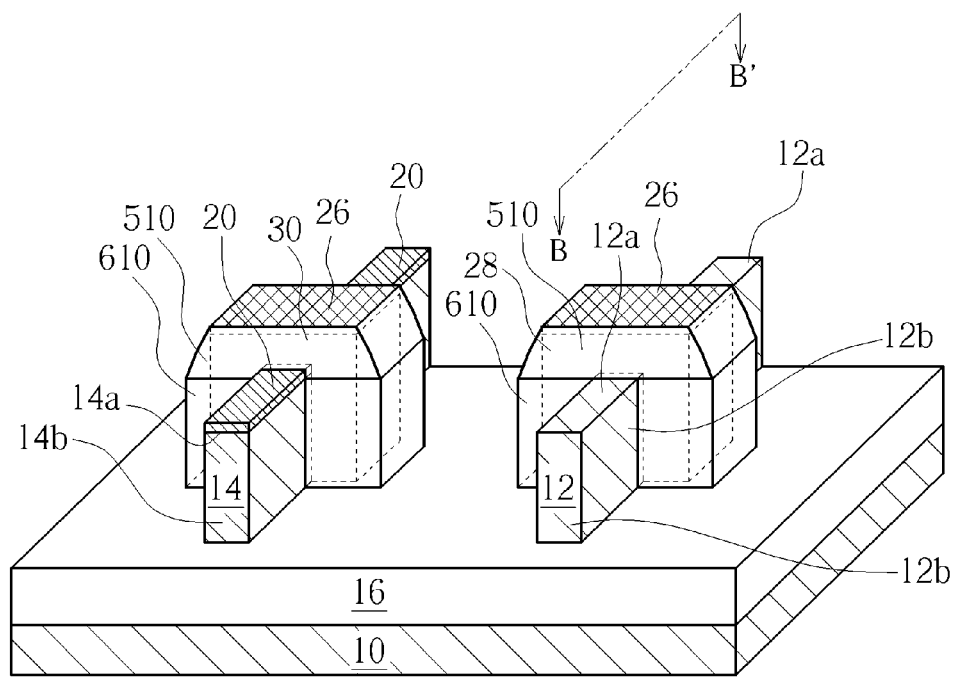

At this time, one main structure of a semiconductor device according to the present invention is accomplished as shown in FIG. 7. In FIG. 7, the first fin structure 12 at two sides of the first gate semiconductor layer 28 and the second fin structure 14 at two sides of the second gate semiconductor layer 30 can be respectively exposed from the first spacer 510 and the second spacer 610. It should be noted that, the second spacer 610 is formed through etching the sacrificial layer 110 under the coverage of the first spacer 510. In this embodiment, each spacer in non-planar FETs is a stack structure composed of the second spacer 610/the first spacer 510 where the first spacer 510 is disposed above the second spacer 610. Furthermore, the top surface of the second spacer 610 is approximately aligned with the top surface 12a and 14a of the fin structure 12 and 14. An ion implantation process is then carried out to form at least a doped region (not shown) in each of the fin structures 12 and 14 at each side of the gate semiconductor layers 28 and 30. The doped region can serve as a source/drain region in a non-planar FET. In this embodiment, a light doped drain (LDD) may be formed before the formation of the source/drain region.

Figure 8:
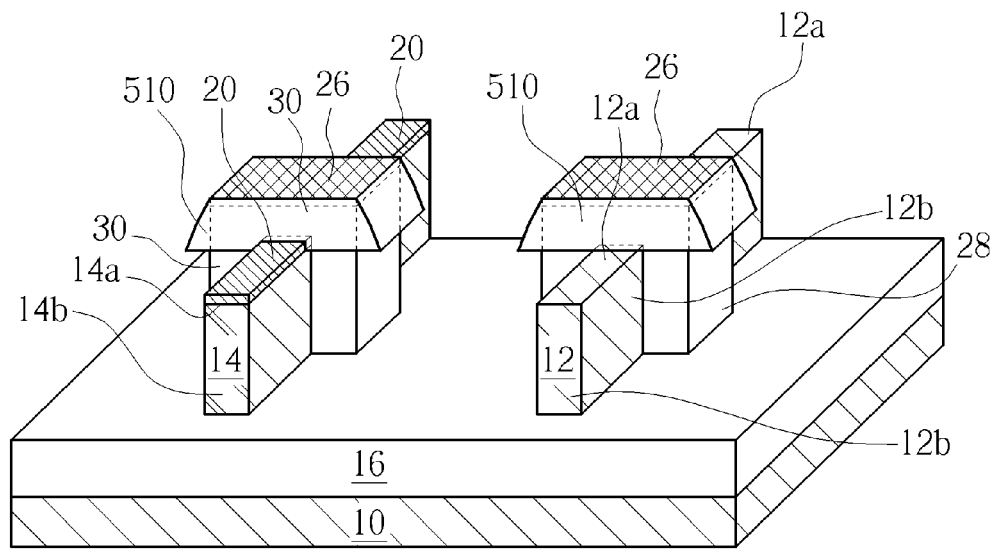

In the above embodiment, the anisotropic dry etching process (also-called the second etching process) is performed in order to removed the sacrificial layer 110 exposed from the first spacer 510. According to another embodiment of the present invention, however, the second etching process may be an etching process with isotropic etching property so that the entire sacrificial layer 110 under the first spacer 510 can be removed. The corresponding fabrication processes are described as follows. First, similar to the process shown in FIG. 6, the second etching process 620 is carried out. However, the second etching process 620 performing in this embodiment has an isotropic etching property, which may be a wet etching process. In this way, he entire sacrificial layer (not shown) above the insulating layer 16 can be removed completely and one main structure of the invention can be obtained as shown in FIG. 8. In the structure shown in FIG. 8, no sacrificial layer exists under the first spacer 510 and sidewalls of the gate semiconductor layer 28 and 30 are no longer covered by the sacrificial layer. It is worth noting that, in another embodiment, if the composition of the sacrificial layer 110 is APF, as the APF including amorphous carbon, it is usually removed completely through an ashing process. Because the processes subsequent to the removal of the APF is similar to the processes described in the preceding embodiment, the description of which is therefore omitted for the sake of clarity and convenience.

Figure 9:
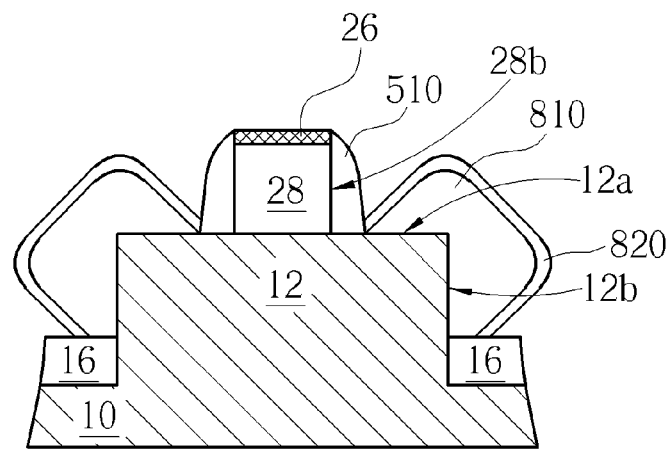

Next, please refer to FIG. 9. FIG. 9 is a schematic, cross-sectional diagram corresponding to a structure taken along a line BB' in FIG. 7. It is worth noting that a process shown in FIG. 9 may be subsequent to the process shown in FIG. 7 or FIG. 8. For the sake of clarity and convenience, only one case, where the process shown in FIG. 9 is a process subsequent to FIG. 7, is described in the following paragraphs, but is not limited thereto. First, optionally, an epitaxy growth process is carried out to form a structure as shown in FIG. 9. In FIG. 9, at least an epitaxial structure 810 is formed and is substantially in contact with the top surface 12a and side surfaces 12b of the first fin structure 12. The epitaxy growth process may include molecular beam epitaxy (MBE) and the components of the epitaxial structure 810 may include single crystalline silicon, silicon carbide, silicon germanium or the like. Then, a metal layer (not shown) is deposited onto the surface of the epitaxial structure 810 followed by performing at least a thermal process. In this way, metal elements inside the metal layer can react with silicon elements around the surface of the epitaxial structure 810 to form silicide 820 on the surface of the epitaxial structure 810. The above metal layer can be formed through depositing a metal such as titanium (Ti), cobalt (Co), nickel (Ni) or platinum (Pt) using a physical vapor deposition (PVD) technique or a chemical vapor deposition (CVD) technique. In this way, contact resistance between contact plugs and the source/drain regions can be lowered effectively.

Figure 10:
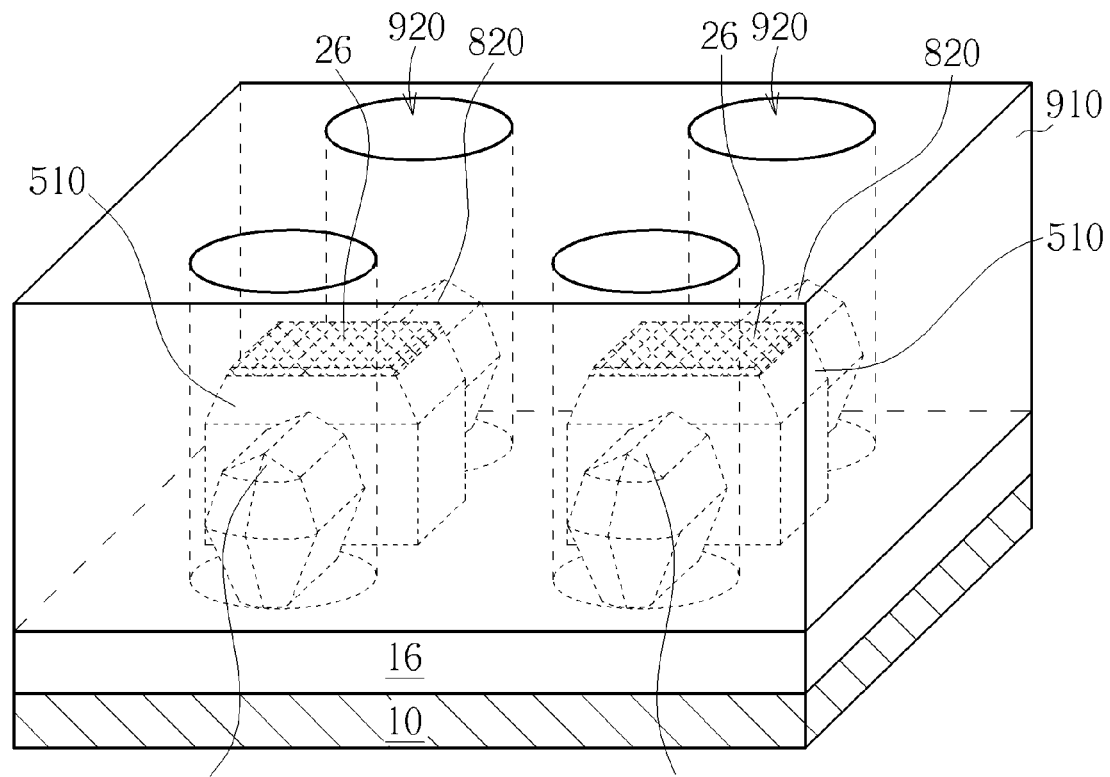
FIG. 10 is a schematic, perspective view showing a method for fabricating a semiconductor device according to another embodiment of the invention.

In the above embodiments, the spacers are formed on the side surfaces of the gate structures and the fin structures at both sides of the gate semiconductor layer are exposed concurrently. The epitaxy growth process is also carried out in order to form the epitaxial layers. However, the present invention is not limited to this embodiment; it could also be applied through another exemplary embodiment. As shown in FIG. 10, according to this embodiment, after the etching process shown in FIG. 7 and the formation of the epitaxial layer shown in FIG. 9, an interlayer dielectric 910 is first deposited on the semiconductor substrate 10 so that the interlayer dielectric 910 can cover the epitaxial structure on each fin structures, the sacrificial layer 110 and the mask layers 26. Next, at least a contact hole 920 is formed in the interlayer dielectric 910 to expose a portion of the corresponding epitaxial structure. The following processes, such as a metal deposition and a thermal process, are carried out, which are similar to the processes shown in FIGS. 7 and 9. In this way, epitaxial structures with metal silicide layer 820 are formed. At this time, a method of fabricating a semiconductor device according to this exemplary embodiment is accomplished.

Figure 11:
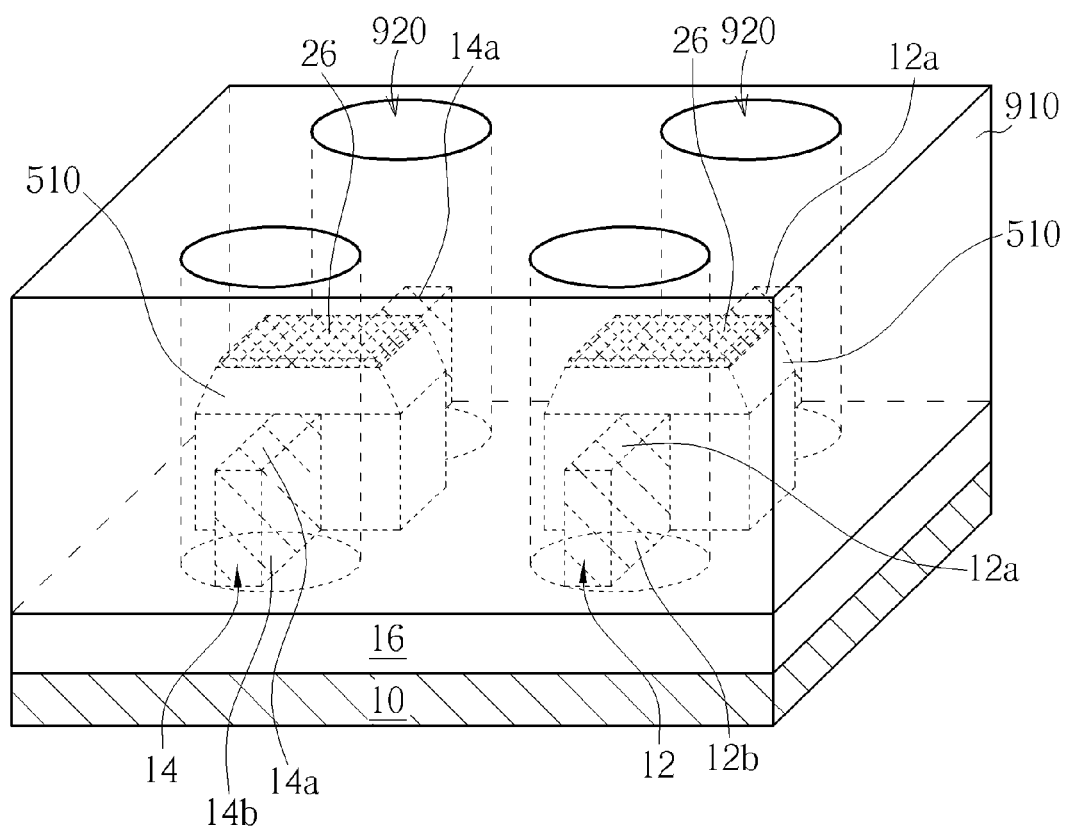
FIG. 11 is a schematic, perspective view showing a method for fabricating a semiconductor device according to still another embodiment of the invention.

Still, according to another embodiment, after the accomplishment of the etching process shown in FIG. 7, an interlayer dielectric 910 may then be deposited on the semiconductor substrate 10 in order to cover each of the fin structures 12 and 14, the sacrificial layer 110 and the mask layer 26. Next, as shown in FIG. 11, at least a contact hole 920 is formed in the interlayer dielectric 910 to expose the top surface 12a and 12b of the fin structures. A same or another dry etching process, for example, is then carried out to further remove the sacrificial layer 110 exposed from the contact hole 920. As a result, side surfaces 12b and 14b of each fin structure 12 and 14 can be further exposed from the corresponding contact hole 920. The following processes are similar to the corresponding process shown in FIG. 9. The processes, such as an epitaxy growth process, a metal deposition and a thermal process are carried out consecutively so that epitaxial structures with metal silicide layer are formed and are in direct contact with top surface and side surfaces of corresponding fin structures 12 and 14.

To summarize, the present invention provides a method of fabricating a semiconductor device. First, a sacrificial layer is deposited to entirely cover the fin structure. Subsequently, a top surface of the fin structure is exposed from the sacrificial layer through a planarization and an etching process. Then, a material layer is deposited, which conformally covers the gate semiconductor layer, the fin structure and the sacrificial layer. The material layer is further etched until the top surface of the fin structure is exposed and a first spacer is concurrently formed on side surfaces of the gate semiconductor layer. Finally, the sacrificial layer may be removed partially or completely in order to expose the fin structure at each side of the gate semiconductor layer. Through the embodiments, entire source/drain regions in the fin structure can be covered by the epitaxial structure having a metal silicide layer. In this way, contact resistance between contact plugs and the source/drain regions is lowered effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a semiconductor substrate;
   forming at least a fin structure and at least a gate semiconductor layer on the semiconductor substrate sequentially, wherein the gate semiconductor layer covers a portion of the fin structure;
   forming a sacrificial layer covering the fin structure;
   exposing a side surface of the gate semiconductor layer from the sacrificial layer;
   exposing a top surface of the fin structure from the sacrificial layer after exposing the side surface of the gate semiconductor layer from the sacrificial layer;
   forming a material layer conformally covering the gate semiconductor layer, the fin structure and the sacrificial layer; and
   etching the material layer to expose the top surface of the fin structure and concurrently form a first spacer on side surfaces of the gate semiconductor layer.

2. The method of claim 1, wherein when exposing the top surface of the fin structure from the sacrificial layer, a top surface of the sacrificial layer is substantially leveled with the top surface of the fin structure.

3. The method of claim 1, wherein when exposing the top surface of the fin structure from the sacrificial layer, a top surface of the sacrificial layer is lower than the top surface of the fin structure.

4. The method of claim 1, wherein before exposing the top surface of the fin structure from the sacrificial layer, further comprises:
   performing a planarization process to have a top surface of the sacrificial layer substantially aligned with a top surface of the gate semiconductor structure.

5. The method of claim 1, wherein the step of exposing the top surface of the fin structure from the sacrificial layer comprises performing an etching back or an ashing process.

6. The method of claim 1, wherein the material layer comprises a multi-layered material.

7. The method of claim 1, wherein after the step of etching the material layer, further comprises forming at least a doped region in the fin structure at each side of the gate semiconductor layer.

8. The method of claim 1, wherein after the step of etching the material layer, further comprises partially removing the sacrificial layer.

9. The method of claim 8, wherein before partially removing the sacrificial layer, further comprises:
   entirely depositing an interlayer dielectric on the semiconductor substrate;
   forming at least a contact hole in the interlayer dielectric to expose a portion of the fin structure.

10. The method of claim 8, wherein after partially removing the sacrificial layer, further comprises forming at least an epitaxial structure substantially in contact with the side surfaces of the fin structure.

11. The method of claim 10, wherein after forming the epitaxial structure, further comprises:
   depositing a metal layer on a surface of the epitaxial structure.

12. The method of claim 10, wherein after forming the epitaxial structure, further comprises:
   forming a metal silicide layer on a surface of the epitaxial structure.

13. The method of claim 1, wherein the step of forming the fin structure comprises:
   forming a semiconductor layer on the semiconductor substrate; and
   etching the semiconductor layer.

14. The method of claim 1, wherein the step of forming the fin structure comprises:
   fabricating a patterned hard mask layer on the semiconductor substrate; and
   forming a semiconductor layer on the semiconductor substrate exposed from the patterned hard mask layer.

15. The method of claim 1, wherein the gate semiconductor layer covers a portion of the top surface and a portion of side surfaces of the fin structure.

16. The method of claim 1, further comprising forming a gate dielectric layer between the gate semiconductor layer and the fin structure.

17. The method of claim 1, wherein the sacrificial layer comprises advanced patterning film (APF) or spin-on-dielectric (SOD).

18. The method of claim 1, wherein the material layer comprises silicon nitride, silicon oxide, silicon oxynitride or the combination thereof.

19. The method of claim 1, further comprising removing the sacrificial layer not covered by the first spacer so as to form a second spacer under the first spacer.

20. The method of claim 1, further comprising completely removing the sacrificial layer after the step of forming the first spacer.

* * * * *